United States Patent [19]

Kane

[11] Patent Number: 4,614,925

[45] Date of Patent: Sep. 30, 1986

[54] RESONATOR FILTERS ON DIELECTRIC SUBSTRATES

[75] Inventor: Johji Kane, Hirakata, Japan

[73] Assignee: Matsushita Electric Industrial Co., Ltd., Osaka, Japan

[21] Appl. No.: 627,727

[22] Filed: Jul. 3, 1984

[30] Foreign Application Priority Data

| Jul. 5, 1983 | [JP] | Japan | 58-123074 |
| Aug. 1, 1983 | [JP] | Japan | 58-141354 |
| Aug. 1, 1983 | [JP] | Japan | 58-141355 |
| Aug. 2, 1983 | [JP] | Japan | 58-141541 |
| Aug. 4, 1983 | [JP] | Japan | 58-143259 |

[51] Int. Cl.$^4$ .............................. H03H 7/01
[52] U.S. Cl. .................. 333/174; 333/184; 333/185
[58] Field of Search ............. 333/167, 156, 174–176, 333/181–185, 202, 204, 205, 219–221; 361/402; 336/200

[56] References Cited

U.S. PATENT DOCUMENTS

| 2,584,592 | 2/1952 | Kehbel | 336/200 X |
| 2,942,212 | 6/1960 | Mynall | 336/200 X |
| 3,609,600 | 9/1971 | Kassabgi | 333/156 |
| 3,947,934 | 4/1975 | Olson | 333/175 |
| 4,451,804 | 5/1984 | Veisz et al. | 333/185 X |
| 4,468,644 | 8/1984 | Teague et al. | 333/176 X |
| 4,482,474 | 11/1984 | Robertus et al. | 333/140 X |

FOREIGN PATENT DOCUMENTS 632834  12/1949  United Kingdom ............ 333/161

Primary Examiner—Marvin L. Nussbaum
Attorney, Agent, or Firm—Wenderoth, Lind & Ponack

[57] ABSTRACT

A resonator filter has electrodes disposed in a confronting relationship to each other and has a dielectric base plate interposed therebetween. The filter has ground or common terminals on the electrode portions in different positions which do not include mutually confronting electrode portions. The electrodes have spiral configurations or configurations having at least one bent portion such that the electrodes have a lumped-constant inductance. Voltage signals induced in the electrodes due to mutual induction therebetween are opposite in phase with respect to each other and a parasitic distributed-constant capacitance is produced due to a potential difference between the electrodes and a dielectric constant of the dielectric base plate. As a consequence thereof, a two-terminal parallel resonance band pass filter circuit is formed on an equivalent basis which is composed of the lumped-constant inductance of one of the electrodes and the distributed-constant capacitance between the electrodes. The parallel resonance band pass filter has a resonance frequency which is lower than a frequency having its ¼ wavelength equal to an equivalent electrical length of each electrode.

23 Claims, 60 Drawing Figures

FIG. 10(a).
FIG. 10(b).
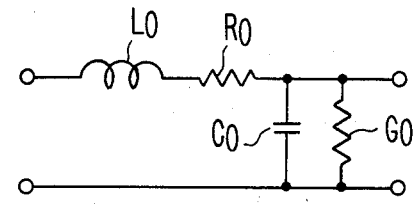
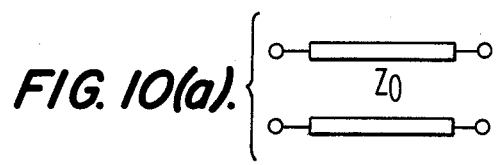
FIG. 11.
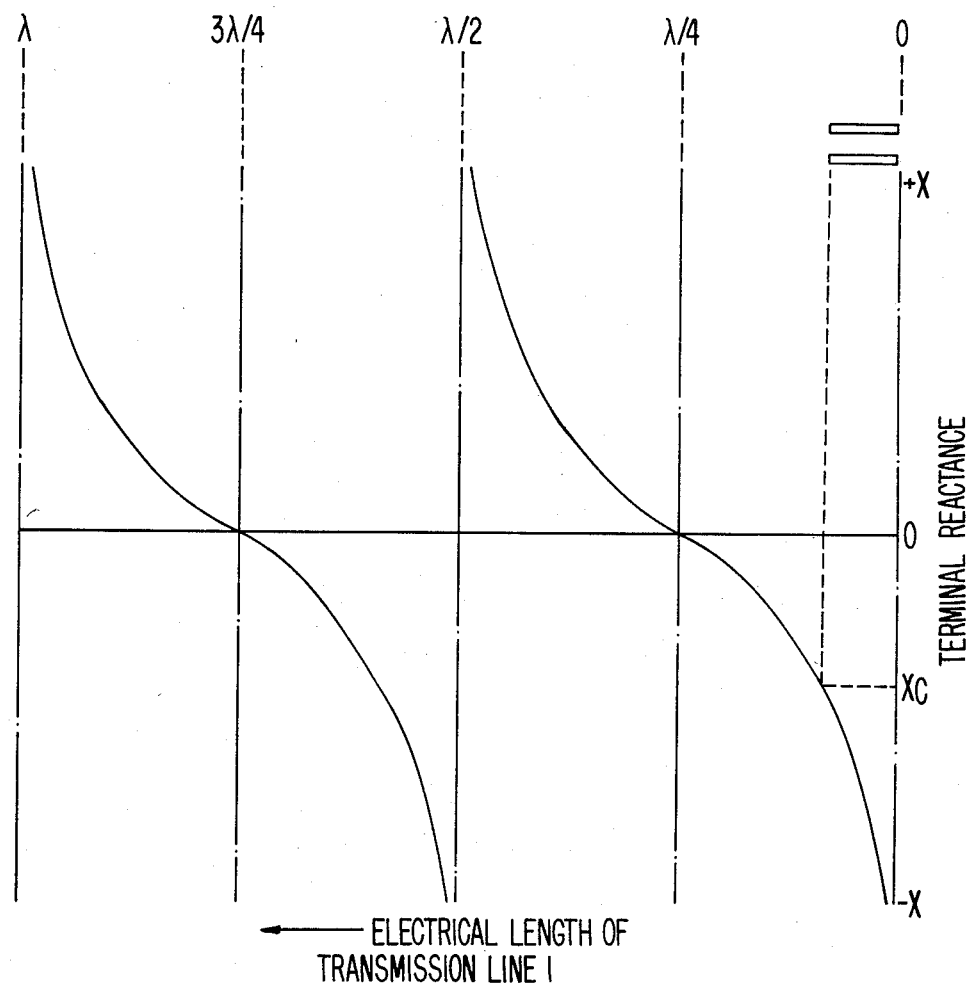

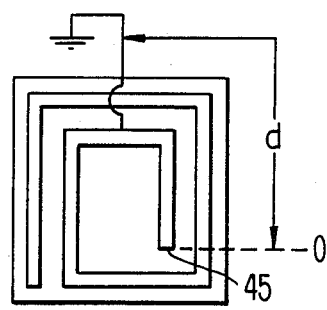
FIG. 27.
FIG. 28.
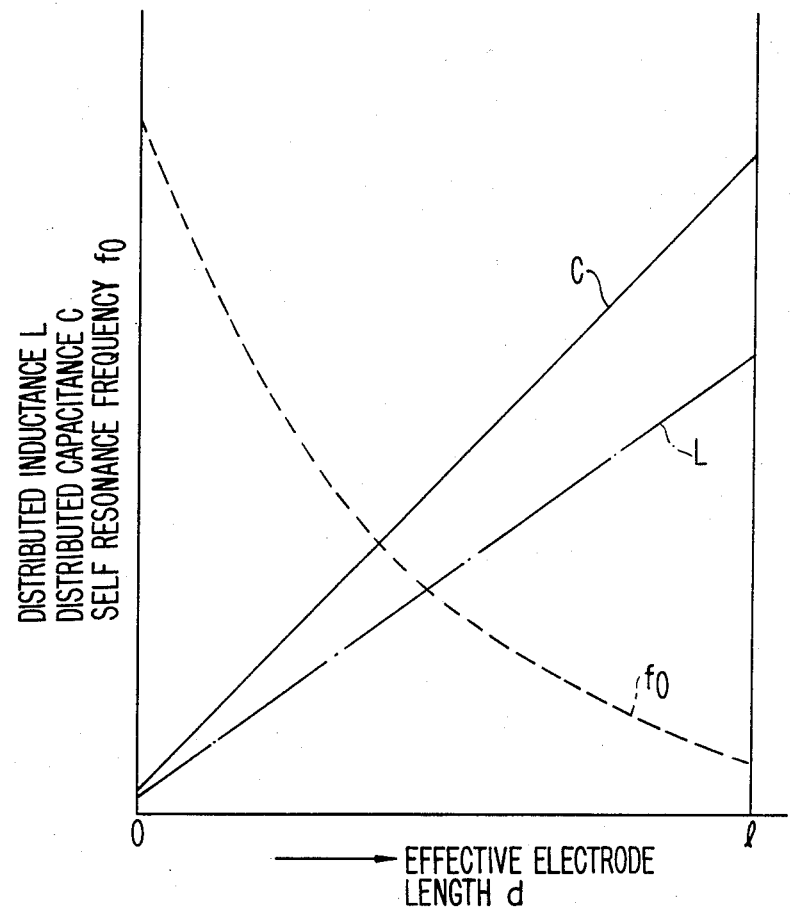
EFFECTIVE ELECTRODE LENGTH d
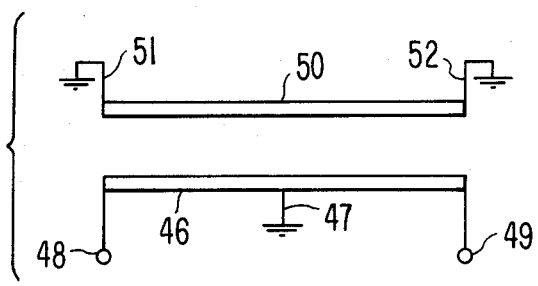
FIG. 29.

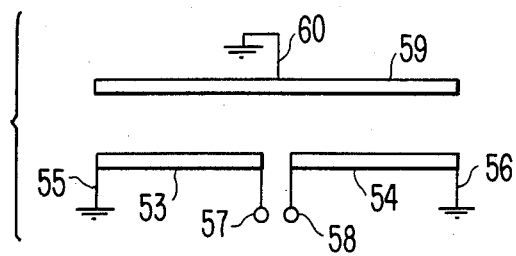
FIG. 30.
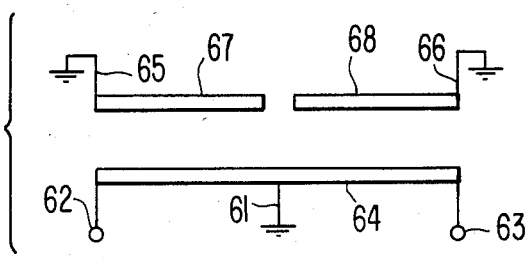
FIG. 31.
FIG. 32.
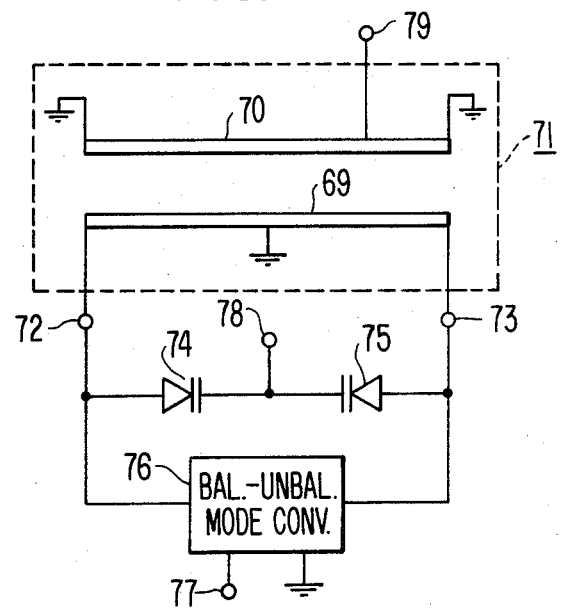

RESONATOR FILTERS ON DIELECTRIC SUBSTRATES

BACKGROUND OF THE INVENTION

1. Field of the Invention

The present invention relates to a resonator filter for use in radio and television transmitters and receivers and other communication equipment.

2. Description of the Prior Art

As more and more signals are used in radio and television broadcasting and communications, resonator filters for selecting the frequencies of the signals to be received are required to be highly stable and reliable in their performance. There has also been a great demand for the reduction of the cost of manufacture of receivers, transmitters and other communication equipment in which the resonator filters are installed. In particular, the development of a new technology is desired for tuning circuit components in radio-frequency stages which have been difficult to improve.

Conventional resonator filters will be described with reference to the drawings. FIG. 1 of the accompanying drawings shows a basic circuit arrangement of a resonator filter. The resonator filter comprises a resonator circuit 3 composed of an inductor 1 and a capacitor 2 which are connected in parallel to each other. The resonator filter has conventionally been constructed of components as illustrated in FIGS. 2 and 3. In one prior arrangement shown in FIG. 2, an inductor component 4 and a capacitor component 5 are interconnected by conductors 6, 7. According to another prior art resonator design, a planar inductor 9 is placed on a plate-like dielectric 8, a capacitor 12 is composed of confronting electrodes 10, 11, and the inductor 9 and the capacitor 12 are interconnected by conductors 13, 14.

However, the conventional arrangements have been subjected to the following disadvantages:

In the resonator shown in FIG. 2, the inductor component 4 is large in size in comparison with the other components, and is particularly much larger in height, with the result that the equipment in which the resonator is incorporated is not rendered smaller in size and lower in profile. A ferrite core inserted in the inductor component is variable in position due to mechanical vibrations, resulting in wide drifts in tuning frequencies. The inductance of the inductor component is unstable due to a large degree of temperature-dependency of the magnetic permeability $\Xi$ of the ferrite core, a feature which also causes tuning frequencies and also Q of the resonator filter circuit to vary widely. For keeping the tuning frequencies stable at their target settings, the components are required to be very accurately installed in predetermined positions. Where the resonator filters are mass-produced as RF resonator filters, it is difficult to maintain a desired installation accuracy and hence the tuning frequencies tend to differ greatly from their target settings and cannot be caused to converge to fixed values. Therefore, there has been difficulty experienced with the mass production of the resonator filters.

The resonator filter illustrated in FIG. 3 has suffered a problem in that the inductor and the capacitor take up a large area to thereby prevent the equipment incorporating the resonator filter from being smaller in size. The resonator filter requires at least three electrodes, that is, the inductor electrode and the confronting capacitor electrodes. Since a large quantity of electrode material having a high conductivity and hence a high cost is used, the cost of manufacture of the resonator filter is high and efforts to reduce the amount of material are impossible to make.

The resonator filter arrangements shown in FIGS. 2 and 3 further have common drawbacks. The inductor and the capacitor are constructed as separate components that are interconnected by long conductors. The long conductors tend to produce unwanted lead inductances and stray capacities which cause the resonator filters to operate is an unstable fashion and make it difficult to achieve an initial design target. Accordingly, it takes a long period of time to design resonator filters, including corrective design actions. Since the resonator filters are composed of discrete components which perform minimum functions, it has been impossible with available technological concepts to reduce the number of components used and cope with demands for an improved manufacturing process. One resultant problem is that there is a limitation on efforts to lower the cost of the resonator filters.

SUMMARY OF THE INVENTION

It is an object of the present invention to provide a resonator filter which is composed of an integral construction of inductor and capacitor components, is low in profile, small in size, mechanically stable, has tuning frequencies and Q less dependent on temperature, is stable at high frequecies without suffering from adverse influences due to connector leads, and has a reduced number of components which permit its manufacturing process to be improved.

To achieve the above object, according to the present invention, electrodes are disposed in confronting relationship to each other with a dielectric base plate interposed therebetween and have ground or common terminals on electrode portions in different positions which do not include mutually confronting electrode portions. The electrodes have spiral configurations or configurations having at least one bent portion such that the electrodes have a lumped-constant inductance.

With such an arrangement, voltage signals induced in the electrodes due to mutual induction therebetween are opposite in phase with respect to each other. A parasitic distributed-constant capacitance is produced due to a potential difference between the electrodes and a dielectric constant of the dielectric base plate.

As a consequence, a two-terminal network, parallel resonance bandpass filter circuit is formed on an equivalent basis which is composed of the lumped-constant inductance of one of the electrodes and the distributed-constant capacitance between the electrodes. The parallel resonance bandpass filter has a resonance frequency lower than a frequency having its ¼ wavelength equal to an equivalent electrical length of each electrode.

Furthermore, the resonance frequency can be trimmed, and a resonance bandpass frequency can be controlled by a combination of the resonance filter with a variable-reactance element.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIGS. 4(a), 4(b) and 4(c) through 7(a), 7(b) and 7(c) are front, side, and rear elevational views, respectively, of resonator filters according to embodiments of the present invention;

FIGS. 9(a) through 9(e), 10(a) and 10(b), and 11 are diagrams explanatory of the principles of operation of the resonator filter of the invention;

FIG. 27 is a rear elevational view of the resonator filter of FIGS. 22(a) through 22(c), explanatory of the adjustment variable mode;

FIG. 28 is a diagram showing characteristic curves explanatory of the adjustment variable mode of the resonator filter of FIGS. 22(a) through 22(c);

FIGS. 29 through 32 are circuit diagrams of balanced resonator filters according to other embodiments of the present invention;

DESCRIPTION OF THE PREFERRED EMBODIMENTS

Figure 1:
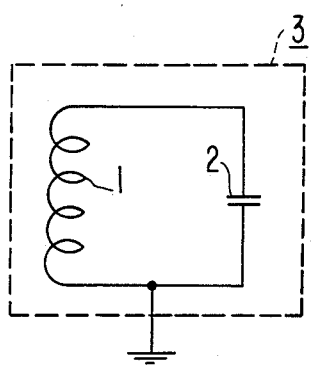
FIG. 1 is a circuit diagram of a basic resonator filter.
Figure 2:
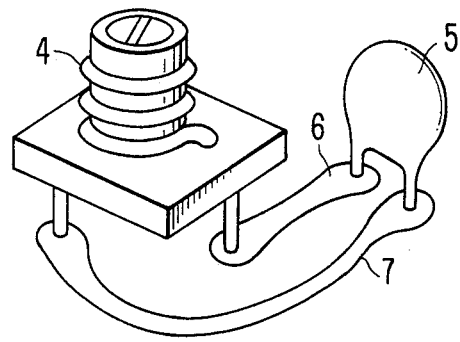
FIGS. 2 and 3 are perspective views of the constructions of conventional resonator filters.
Figure 3:
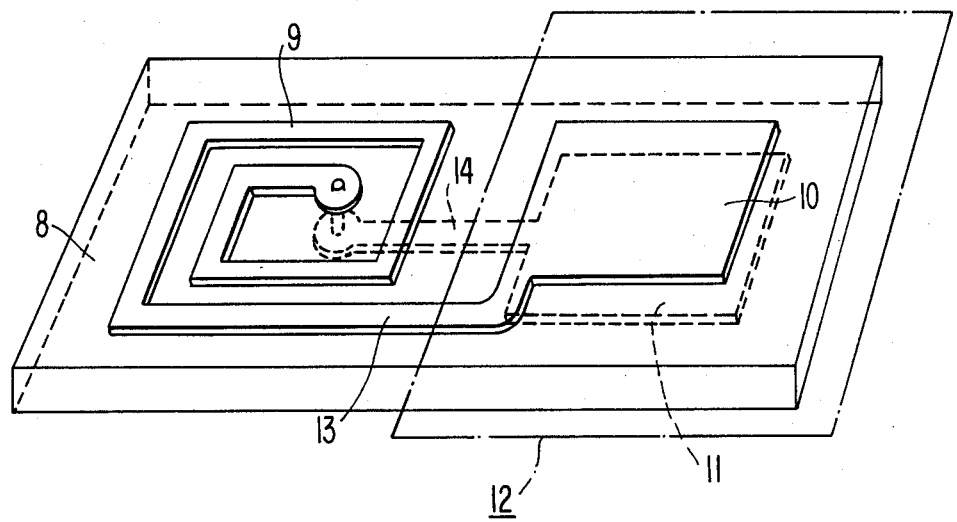

Most resonator filters having the basic tuning circuit shown in FIG. 1 and used in HF, VHF, and UHF bands are constructed of individual lumped-constant reactance elements interconnected and put together as illustrated in FIG. 2. A resonator filter including individual distributed-constant reactance elements, as shown in FIG. 3, because of long wavelengths corresponding to the above frequency bands, and a distributed-constant resonator such as a quarter-wave resonator and a dielectric resonator (not shown) have their components scattered and are of quite a large configuration. However, distributed-constant resonator filters and resonators can easily be constructed of solid-state components. The present invention is based on the idea that where it is ideal and possible for resonator filters used in the above frequency bands to be constructed of solid-state components which are put together, it is best to achieve resonator filters in optimum form by allowing lumped-constant and distributed-constant reactors to act effectively and be combined together.

Resonator filters according to embodiments of the present invention will hereinafter be described in detail with reference to the drawings.

FIGS. 4(a), 4(b) and 4(c) through 7(a), 7(b) and 7(c) illustrate the constructions of resonator filters according to embodiments of the present invention.

Figure 4A:
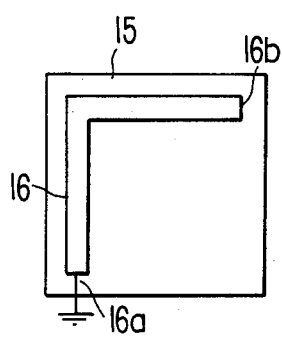
Figure 4B:
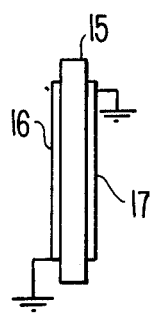
Figure 4C:
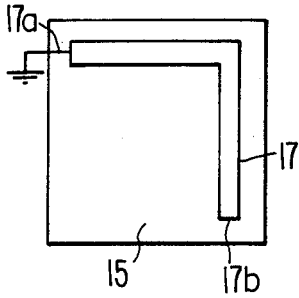

In FIGS. 4(a), 4(b) and 4(c), a dielectric 15 in the form of a plate is made of ceramic and supports an electrode 16 forming an inductor on a surface of the dielectric 15 and another electrode 17 disposed on an opposite surface of the dielectric 15 in a confronting relationship to the electrode 16. The electrodes 16, 17 jointly form a distributed-constant circuit forming a capacitor. The electrode 16 has a ground terminal 16a and an open terminal 16b, and the electrode 17 has a ground terminal 17a and an open terminal 17b which are opposite to the terminals 16b, 16a, respectively. Each of the electrodes 16, 17 has one bent portion having a desired bent angle and direction.

Figure 5A:
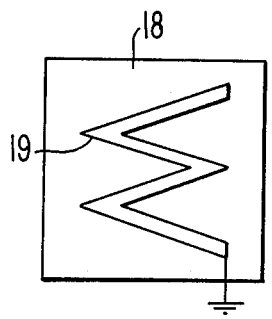
Figure 5B:
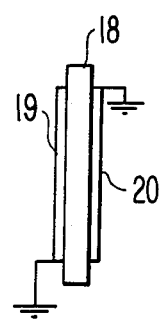
Figure 5C:
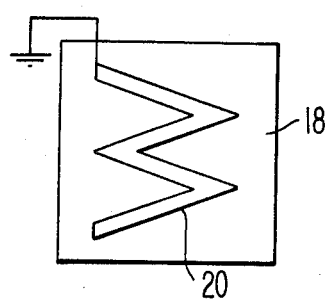
Figure 6A:
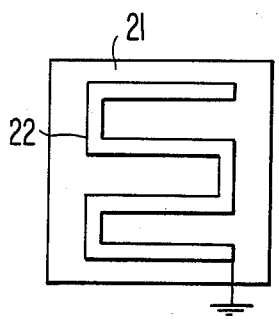
Figure 6B:
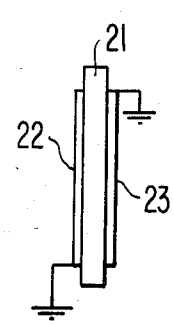
Figure 6C:
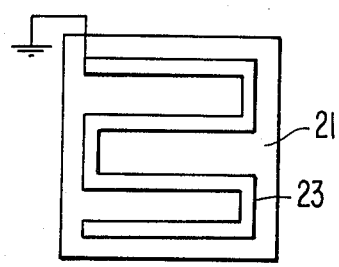

In FIGS. 5(a) through 5(c), electrodes 19, 20 are mounted on opposite surfaces of a dielectric 18 in the from of a plate, and in FIGS. 6(a) through 6(c), electrodes 22, 23 are mounted on opposite surfaces of a dielectric 21 in the from of a plate. As illustrated in FIGS. 5(a) through 5(c) and 6(a) through 6(c), the electrodes are mounted on the dielectrics and have a terminal arrangement in the same manner as described with reference to the embodiment of FIGS. 4(a) through 4(c). However, each of the electrodes has more than one bent portion having a desired bent angle and direction.

Figure 7A:
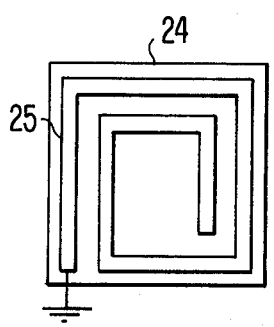
Figure 7B:
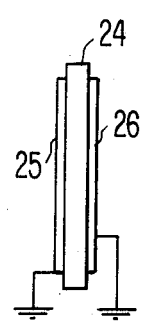
Figure 7C:
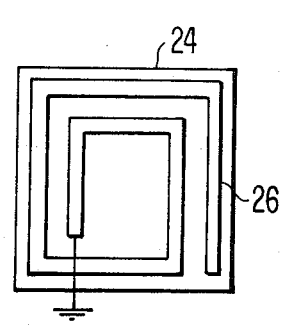

In FIGS. 7(a) through 7(c), electrodes 25, 26 are mounted on opposite surfaces of a dielectric 24 in the from of a plate. The electrodes are mounted on the dielectrics and have a terminal arrangement in the same manner as described with reference to the embodiment of FIGS. 4(a) through 4(c). However, each of the electrodes has a spiral configuration.

Although in the embodiments shown in FIGS. 4(a), 4(b) and 4(c) through 7(a), 7(b) and 7(c) each electrode has a bent portion formed as an angular pattern having a desired bent angle, the electrode may instead have a bent portion formed as an arcuate pattern having a desired curvature.

Figure 8A:
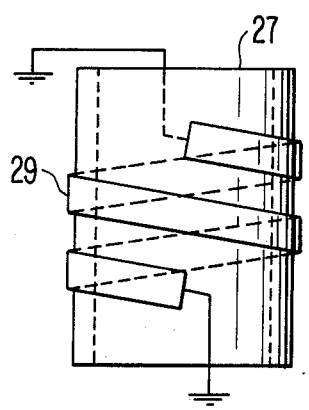
FIGS. 8(a) and 8(b) are front elevational and plan views of a resonator filter according to another embodiment of the present invention.
Figure 8B:
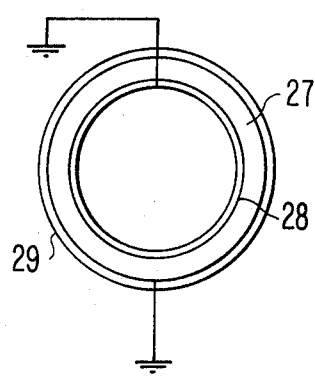

FIGS. 8(a) and 8(b) show the construction of a resonator filter according to another embodiment of the present invention. A tubular dielectric 27 supports an electrode 28 on an inner peripheral surface thereof and an electrode 29 on an outer peripheral surface thereof, the electrodes 28, 29 extending in confronting relation to each other. The electrodes 28, 29 have ground terminals located at opposite ends thereof. The dielectric 27 may be in the form of a hollow structure having a rectangular cross section.

The terminals that are designated as ground terminals in the foregoing embodiments may not be used as ground terminals but may serve as general common terminals for connection to other circuits (not shown).

The resonator filters shown in FIGS. 4(a), 4(b) and 4(c) through 7(a), 7(b) and 7(c) can form relatively large distributed inductors and capacitors though they take up small areas. Therefore, small resonator filters having relatively low tuning frequencies can be achieved with a resulting increased space factor.

The resonator filter shown in FIGS. 8(a) and 8(b) is smaller in size than the resonator filters shown in FIGS. 4(a), 4(b) and 4(c) through 7(a), 7(b) and 7(c), but can form a sufficiently large inductor and capacitor. Therefore, a much smaller resonator filter having a sufficient tuning frequency can be accomplished. The resonator filter of FIGS. 8(a) and 8(b) can be mass-produced with ease by continuously forming electrodes 28, 29 on an elongate continuous tubular dielectric 27 and then cutting the tubular dielectric 27 to the desired lengths.

The electrodes, or transmission-line electrodes, in the foregoing embodiments may be constructed of a metal conductor, a printed metal-foil conductor, a printed thick-film conductor, or a thin-film conductor, or may comprise a combination of these conductors. The dielectric may be made of alumina ceramic, barium titanate, plastics, Teflon (trademark), glass, mica, or in the form of a printed-circuit board of resin base.

Figure 9A:
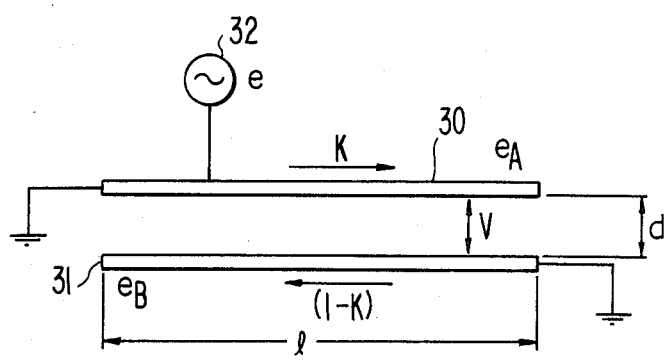

Operation of the resonator filter in each of the foregoing embodiments will now be described. FIGS. 9(a) through 9(e) are circuit diagrams of equivalent circuits of the resonator filter of the present invention. In FIG. 9(a), transmission lines are composed of transmission-line electrodes 30, 31 having an electrical length l and including ground terminals disposed at opposite ends. A signal source 32 for generating a voltage e is connected to the transmission-line electrode 30 for supplying a signal thereto. When the signal is applied, a traveling-wave voltage $e_A$ is excited at the open terminal on the distal end of the transmission-line electrode 30. Since the transmission-line electrode 31 is disposed in confronting or juxtaposed relationship to the transmission-line electrode 30 adjacent thereto, a voltage is induced in the transmission-line electrode 31 by mutual induction. A traveling-wave voltage $e_B$ is then induced at the open terminal on the distal end of the transmission-line electrode 31.

With the ground terminals of the transmission-line electrodes 30, 31 being disposed in an opposite relationship or remotely from each other, the induced traveling-wave voltage $e_B$ is opposite in phase to the excited traveling-wave voltage $e_A$. Since the distal ends of the transmission lines are open, the traveling-wave voltages $e_A$, $e_B$ form voltage standing waves in the transmission lines which are composed of the transmission-line electrodes 30, 31, respectively. Assuming that a voltage distribution coefficient indicative of the distribution of the voltage standing wave in the transmission-line electrode 30 is expressed by K, a voltage distribution coefficient of the transmission-line electrode 31 can be expressed by (1−K).

A potential difference V between any confronting portions of the transmission-line electrodes 30, 31 is expressed by:

$$V = Ke_A - (1-K)e_B \quad (1)$$

On the condition that the transmission-line electrodes 30, 31 are of the same electrical length l, $$e_B = -e_A \quad (2)$$

Thus, the potential difference V given by the above equation (1) can now be expressed by:

$$V = Ke_A + (1 - K)e_A \quad (3)$$
$$= e_A$$

Therefore, the potential difference V can be generated between all confronting portions of the transmission-line electrodes 30, 31.

It is assumed here that the transmission-line electrodes 30, 31 have a width W (with their thickness being small) and are spaced a distance d from each other by a dielectric having a dielectric constant $\epsilon_s$. A capacitance $C_O$ formed per unit length of the transmission lines is given as follows:

$$C_O = \frac{Q}{V} = \frac{Q}{e_A} \quad (4)$$

$$Q = \epsilon_0\epsilon_s \frac{W \cdot V}{d} = \epsilon_0\epsilon_s \frac{W \cdot e_A}{d} \quad (5)$$

Therefore, $$C_O = \epsilon_0\epsilon_s \frac{W}{d} \quad (6)$$

Figure 9B:
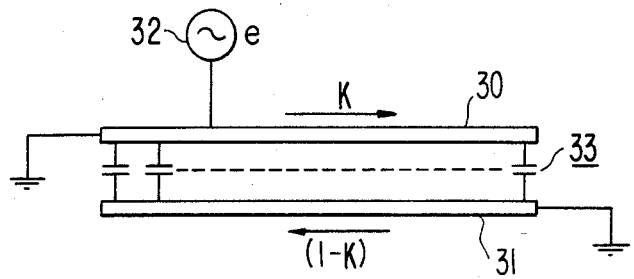
Figure 9C:
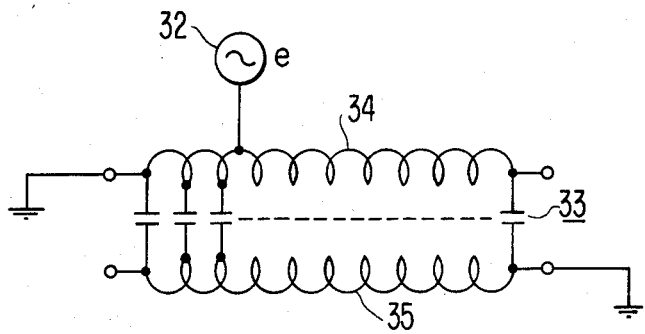
Figure 9D:
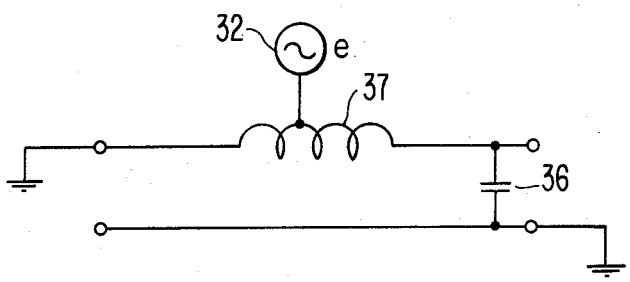
Figure 9E:
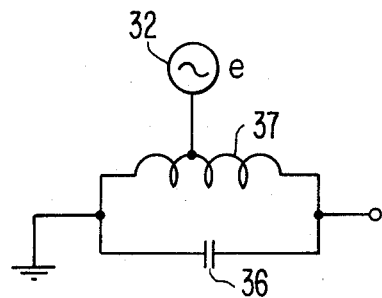

Accordingly, the transmission lines shown in FIG. 9(a) are equivalent to transmission lines as shown in FIG. 9(b) having distributed capacitors 33 of $C_O$ determined by the equation (6) per unit length. As illustrated in FIG. 9(c), the transmission lines can be equivalently expressed as a distributed-constant circuit composed of total distributed inductors 34, 35 due to distributed inductor components of the transmission lines and lumped inductor components produced by the bent configuration of the transmission lines and a distributed capacitor 33.

Now, the relationship between the formation of the distributed capacitor 33 and the electrical length l of the transmission lines will be described. A characteristic impedance $Z_O$ per unit length of the transmission lines shown in FIG. 10(a) can be expressed by an equivalent circuit illustrated in FIG. 10(b). The characteristic impedance $Z_O$ is generally given by:

$$Z_O = \sqrt{\frac{R_O + j\omega L_O}{G_O + j\omega C_O}} \quad (7)$$

If the transmission lines cause no loss, $$Z_O = L_O/C_O \quad (8)$$

This assumption can be applied to many of the resonator filters according to the embodiments of the invention. For the sake of brevity, the characteristic impedance $Z_O$ defined by the equation (8) will hereinafter be used. The capacitance $C_O$ in the equation (8) is the same as the capacitance $C_O$ per unit length of the transmission lines as determined by the equation (6). More specifically, the characteristic impedance $Z_O$ per unit length of the transmission lines is a function of the capacitance $C_O$, and also a fuction of the dielectric constant $\epsilon_s$ of the dielectric, the width W of the transmission-line electrodes, and the distance d between the transmission-line electrodes.

An equivalent reactance X at a terminal of a transmission line having a characteristic impedance $Z_O$ per unit length thereof, an electrical length l, and an open distal end can be expressed by:

$$X = -Z_O \cot\theta \quad (9)$$

where $$\theta = 2\pi \frac{l}{\lambda} \quad (10)$$

When $$\left. \begin{array}{l} \theta = 0 \sim \frac{\pi}{2} \\ = \pi \sim \frac{3}{4}\pi \end{array} \right\} \quad (11)$$

the equivalent reactance X is given by:

$$X \leq 0 \quad (12)$$

Therefore, the equivalent reactance at the terminal of the transmission line can be a capacitive reactance. Where $\theta$ falls in the ranges of the equation (11) because of the electrical length l of the transmission line, or by selecting the electrical length l to be $\lambda/4$ or less, a capacitor can be formed. The capacitance C of the capacitor thus formed is:

$$C = \frac{1}{\omega|X|} = \frac{1}{\omega Z_O \cot\theta} \quad (13)$$

$$= \frac{1}{\omega \sqrt{\frac{L_O}{C_O}} \cot\theta}$$

Therefore, any desired capacitance C can be achieved by varying $\theta$ or selecting the electrical length l of the tranmission line.

FIG. 11 is illustrative of the mode of operation of the transmission lines described with reference to the above equations (9) through (13). In FIG. 11, the equivalent reactance X generated at the terminals is shown as being varied as the electrical length of the transmission lines with open distal ends varies. As is apparent from FIG. 11, it is possible to form a negative terminal reactance if the electrical length l is $\lambda/4$ or below or in the range of from $\lambda/2$ to $4\lambda/3$, that is, a capacitor can equivalently be formed. Furthermore, under the condition to form a negative terminal reactance, the capacitance C can be of a desired value by selecting any desired electrical length l of the transmission lines.

The capacitor C can be equivalently replaced with a lumped-constant capacitor 36 shown in FIG. 9 (d). The inductor formed by the total of distributed inductor components present in the transmission lines and lumped inductor components generated by the bending of the transmission lines can be equivalently replaced with a lumped-constant inductor 37. By expressing the ground terminals in FIG. 9(d) as a common ground terminal, the arrangement can finally be equivalent to a parallel resonator circuit as shown in FIG. 9(e) which is composed of a lumped-constant capacitor 36 and a lumped-constant inductor 37, thus realizing a resonator filter.

The resonator filter of the invention is realized on the basis of the arrangement and operation described above. The construction and principles of operation of the resonator filter according to the present invention are entirely different from those of the conventional resonator filters. To indicate that the resonator filter of the present invention differs entirely from a conventional resonator filter or another resonator filter arrangement using the same transmission lines as those in the resonator filter of the invention, the construction and operation of the conventional resonator filter or the other resonator filter arrangement using the same transmission lines will hereinafter be described. This will serve to clarify the difference between the resonator filter of the present invention and the conventional resonator filter and also the novelty of the resonator filter of the present invention.

Figure 12:
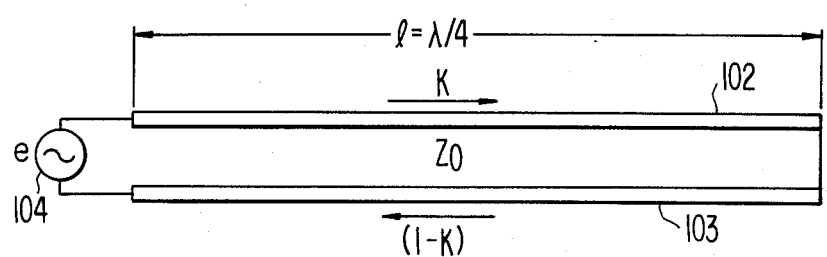
FIG. 12 is a diagram illustrative of the principles of operation of a conventional quarter-wave resonator.

FIG. 12 is illustrative of the circuit arrangement of a quarter-wave resonator which has heretofore been used most widely. The illustrated prior art resonator is fully different from the resonator filter of the invention as to the distal ends of the transmission lines, selection of the length thereof, and selection of ground terminals. In FIG. 12, balanced-mode transmission-line electrodes 102, 103 have an electrical length l equal to $\lambda/4$ at a resonance frequency and their distal ends short-circuited. The transmission-line electrodes are driven in a balanced mode by a balanced signal source 104 which generates a voltage e. A ground terminal is selected to be located at a neutral point of the balanced signal source 104, and no ground terminal is placed at any terminal of the transmission-line electrodes. An equivalent terminal reactance X produced at the terminals of the transmission lines is given by:

$$X = Z_O \tan\theta \quad (14)$$

where $Z_O$ is a characteristic impedance of the transmission lines and equal to the one indicated by the equation (8) and $\theta$ is equal to the one indicated by the equation (10). The electrical length l of the transmission lines of this resonator is:

$$l = \lambda/4 \quad (15)$$

and hence, $$\theta = \pi/2 \quad (16)$$

Therefore, the terminal reactance X in the equation (14) becomes:

$$X = Z_O \tan(\pi/2) = \infty \quad (17)$$

As a consequence, parallel resonance characteristics can equivalently be obtained. The construction of the quarter-wave resonator above will be compared with that of the resonator filter of the present invention. With respect to the terminal condition, the terminals of the resonator filter of the invention are open, whereas those of the conventional quarter-wave resonator are short-circuited, so that the terminal conditions are entirely different. As to the electrical length l of the transmission lines, the electrical length of the resonator filter of the invention is selected to be $\lambda/4$ or shorter, and about $\lambda/16$ in reality. However, the electrical length of the prior art quarter-wave resonator is strictly selected to be λ/4 of the resonance frequency. Therefore, it is apparent that the electrical lengths l of the transmission lines are also basically different from each other. Because of the difference betwen the electrical lengths of the transmission lines, the resonator filter of the present invention can be of a smaller size when the resonator filter of the invention and the prior art resonator are designed for use at the same tuning frequency or resonance frequency. The quarter-wave resonator is required to have much longer transmission lines, and has to be larger in size. Some prior art quarter-wave resonators are rendered smaller in size by shortening the transmission lines with a dielectric having quite a large dielectric constant. The dielectric with a large dielectric constant is generally subjected to a high dielectric loss tan δ, and the Q of the resonator tends to be greatly reduced. Furthermore, the dielectric constant of the dielectric with a high dielectric constant is generally highly temperature-dependent, and it is difficult to maintain the stability of a tuning frequency.

Figure 13:
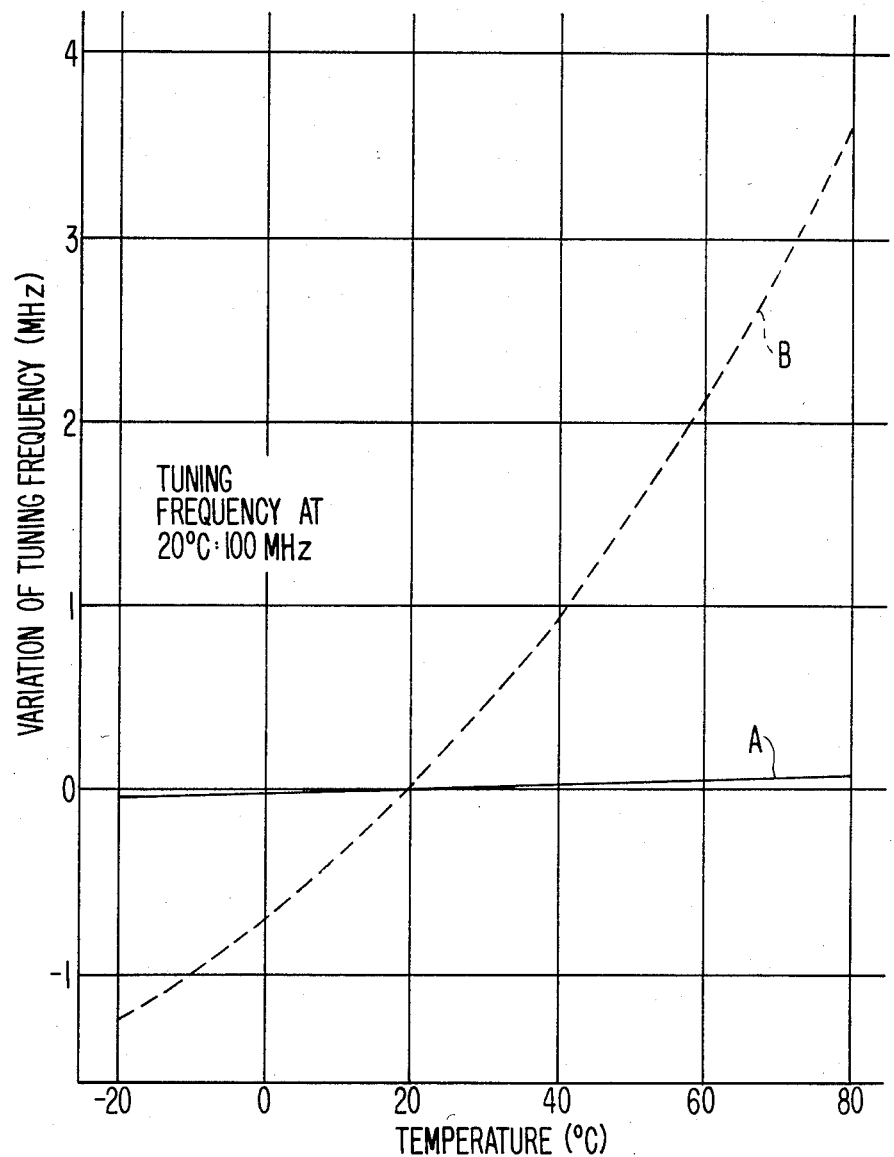
FIGS. 13 and 14 are diagrams showing characteristic curves of tuning frequencies and Q, dependent on temperature, of resonator filters of the present invention and the prior art.
Figure 14:
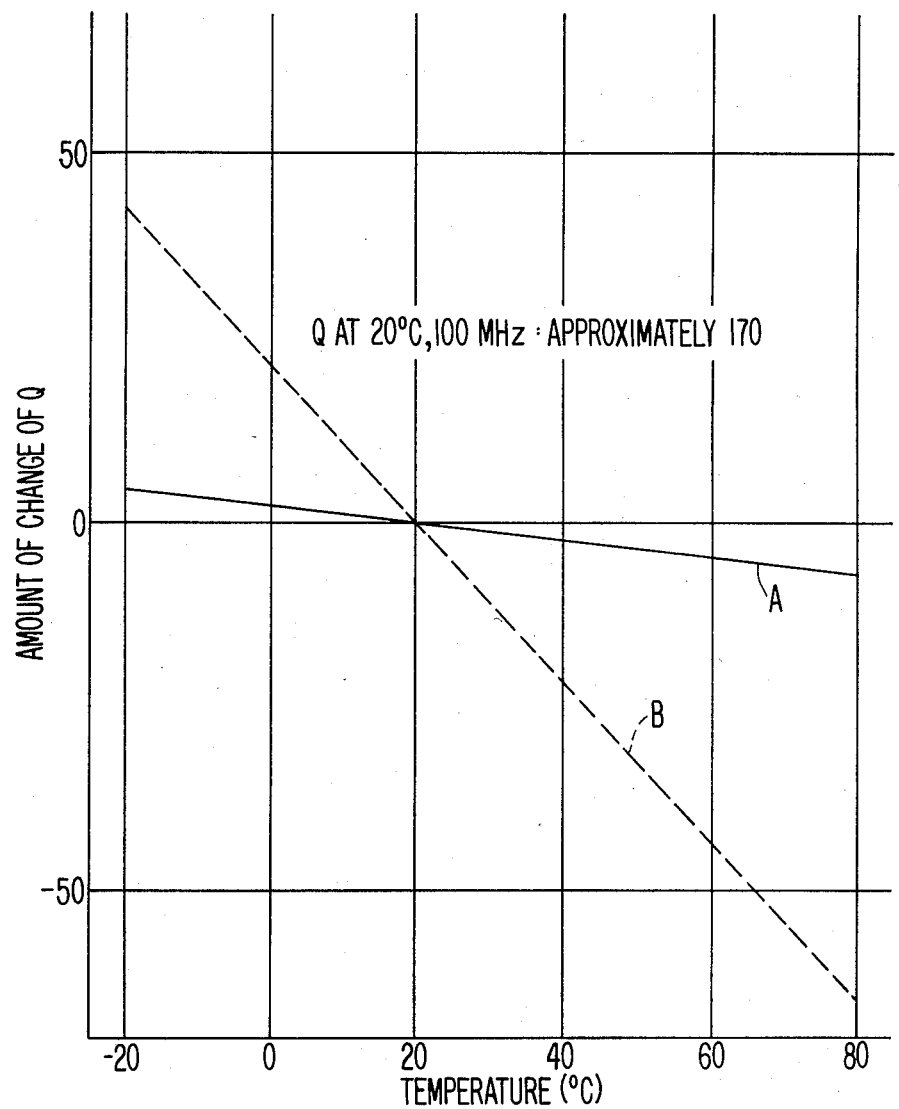

Superior performance of the resonator filter of the present invention will be described with reference to experimental results indicative of comparison between the performance of the resonator filter of the present invention and that of the prior art resonator filter. FIG. 13 is a graph showing experimental results of the measured temperature-dependency of a tuning frequency, and FIG. 14 is a graph showing experimental results of the measrued temperature-dependency of the Q. In FIGS. 13 and 14, characteristic curves A are indicative of the temperature dependencies of the resonator filter of the present invention, with the dielectric being made of alumina ceramic or in the form of a printed-circuit board of resin base. Characteristic curves B are indicative of the temperature dependencies of the prior art resonator filter which has been most widely used in the art. It is evident from these experimental results that the resonator filter of the present invention, even if constructed of a general dielectric, has a highly stable tuning fruquency, a high Q, and is stable. With the prior art resonator filter, however, the magnetic permeability μ of the ferrite core of the inductor and the Q are basically unstable, and the inductance varies due to expansion and contraction of the coil, with the result that it is difficult to maintain desired stability of the tuning frequency and the Q. Because of these shortcomings, the prior resonator filter has required another temperature compensation component or another automatic stability compansation circuit for compensating for its instability.

With the present invention, as described above, the ground terminals or common terminals of the electrodes disposed in a confronting relationship to each other with the dielectric interposed therebetween are located in an opposite relationship or remotely from each other. Thus, a potential difference is effectively produced bewteen the transmission-line electrodes to form a distributed capacitor, which coacts in parallel with a total inductor composed of a distributed-constant inductor and a lumped-constant inductor of the transmission lines for constituting an equivalent parallel resonator circuit thus realizing as a resonator filter. The resonator filter of the present invention has the following advantages:

(1) An inductor and a capacitor can integrally be constructed through a simple process and of a simple arrangement composed only of two electrodes serving as transmission lines and a single dielectric, so that a resonator filter can be achieved which can be handled as one component.

(2) The resonator filter can be of a very low profile which has not been possible heretofore, and is small in size and light in weight, with the result that the space factor of the resonator filter is greatly improved. Devices in which the resonator filter of the present invention is incorporated can also be lower in profile, smaller in size, and lighter in weight.

(3) Since the resonator filter is constructed as a module having no mechanically moving parts, any variation in the tuning frequency and the Q due to changes in environmental conditions can be greatly reduced. The resonator filter is particularly stable against mechanical vibrations.

(4) The resonator filter is very stable with respect to the temperature dependency of the tuning frequency and the Q when the dielectric is made of a general material such as an alumina ceramic or a printed-circuit board of resin base. It is therefore unnecessary to control the temperature dependency of each component, which has been most difficult to achieve in designing conventional resonator filters. As a result, it is quite easy to design and control the temperature dependency of the resonator filter. Due to the stable temperature dependency and the stability against mechanical vibrations, the reliability of the resonator filter itself and the devices in which the resonator filter is incorporated can greatly be increased.

(5) As compared with microstrip lines (a transmission line with a transmission-line electrode formed on one surface of a dielectric and a wide ground electrode on the other surface of the dielectric) which have widely been used heretofore, a loss due to the closely located ground terminal can be made smaller, so that the resonator filter has a sufficiently high Q.

(6) With the inductor and the capacitor being of an integral construction, it is not necessary to provide the resonator filter with unwanted connector leads. Thus, any unstable elements can be eliminated which would include a lead inductance and a stray capacity generated by the connector leads. The tuning operation of the resonator filter can extend in a stable fashion into very high frequency ranges. Since no unstable element of a reactance component is present with respect to a target design value of the tuning frequency, the desired tuning frequency can easily be achieved, and hence the resonator filter can simply be designed. The process for designing resonator filters can easily be standardized so that the resonator filters can highly efficiently be designed.

(7) Since the resonator filter is constructed of minimum functional elements including transmission-line electrodes and a dielectric only, the resonator filter can be fabricated of a minimum quantity of material. Consequently, the material used can be reduced and the resonator can be manufactured at a reduced cost.

(8) Conventional resonator filters are required to include two components, that is, an inductor and a capacitory. The resonator filter of the present invention, however, is constructed of a single module component so that the number of required parts can be reduced, the cost of assembling the resonator filter can be lowered, and the time required to assemble the resonator filter can be shortened. Since the types and quantities of components in inventory can be reduced, the manufacture control can also be simplified. Therefore, the total cost of the resonator filter can greatly be reduced.

(9) The design of resonator filters can be carried out through a simple artwork which determines patterns of transmission-line electrodes. No much skill is required for the designing of resonator filters, and any design changes can easily be coped with. Where resonator filters are to be designed in an automatic process, a design procedure relying on computer graphics can easily be introduced, since the artwork designing process for the resonator filter of the present invention is well suitable for such an automated design procedure, and design parameters include only the dimensions of transmission-line electrodes and the thickness and dielectric constant of the dielectric which are simple and can readily be converted into data. With the automatic designing process, resonator filters can be designed in a short period of time, with an increased accuracy of tuning frequencies, and with an increased degree of design freedom.

Figure 15A:
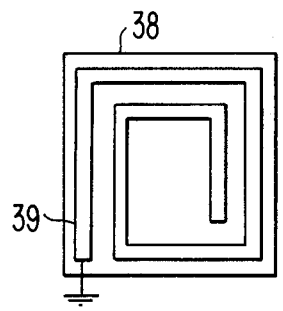
FIGS. 15(a) through 15(c) are front, side, and rear elevational views of a resonator filter according to another embodiment of the present invention.
Figure 15B:
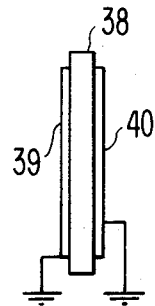
Figure 15C:
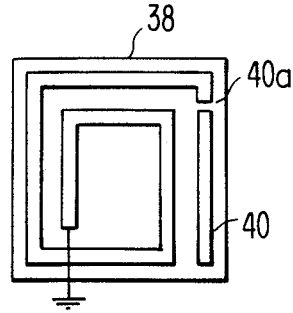

FIGS. 15(a) through 15(c) are illustrative of the construction of a resonator filter according to still another embodiment of the present invention. Electrodes 39, 40 are mounted on opposite surfaces of a dielectric 38 in the form of a plate. The electrodes are mounted on the dielectrics and have a terminal arrangement in the same manner as described with reference to the embodiment of FIGS. 4(a) through 4(c). However, each of the electrodes has a spiral configuration.

If it is desired to adjust the capacitance of the distributed capacitor and the inductance of the distributed inductor, the electrode 40 is cut off at a portion 40a.

The severance of the electrode will be described in greater detail.

Figure 16A:
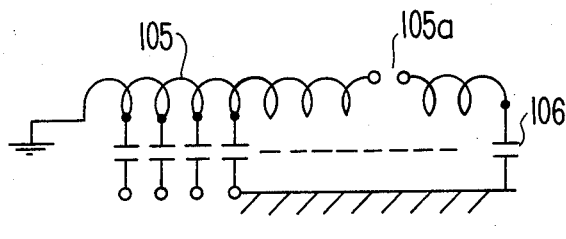
FIGS. 16(a) and 16(b) are circuit diagrams of equivalent circuits of the resonator filter shown in FIGS. 15(a) through 15(c)

By cutting off the electrode, a distributed inductor 105 (FIG. 16(a)) is cut off at an electrode portion 105a. As a result, the values of a distributed capacitance 106 and the distributed inductance 105 can be varied as desired.

Figure 16B:
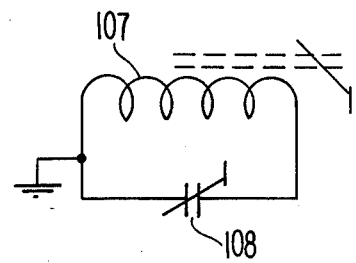

FIG. 16(b) illustrates the resonator filter in the form of a lumped-constant equivalent circuit which comprises a parallel-connected circuit of a variable inductor 107 and a variable capacitor 108.

Figure 17:
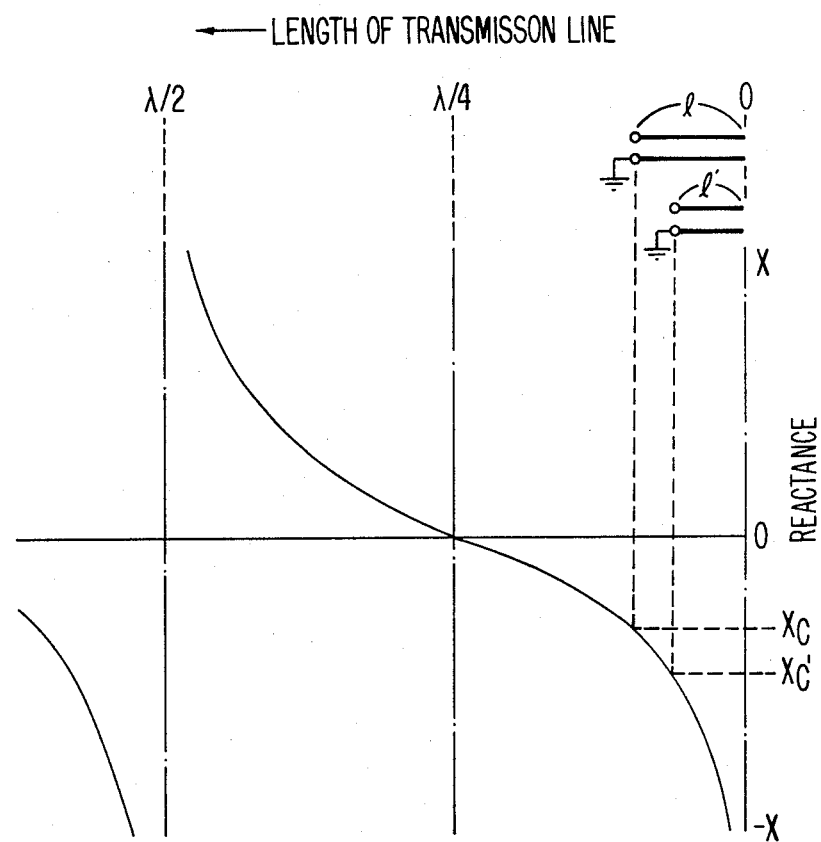
FIG. 17 is a diagram illustrative of operation of the resonator filter of FIGS. 15(a) through 15(c)

The inductance of the inductor of the resonator filter can be designed as desired by adjusting the number of turns of the spiral electrodes or the length of the spiral electrodes. The capacitance of the distributed capacitor can be designed as desired by adjusting the area in which the spiral electrodes confront each other, the dielectric constant $\epsilon$ and thickness of the dielectric. The formation of the distributed capacitance will be described further with reference to FIG. 17. The confronting spiral electrodes have a transmission-line equivalent length l which is designed to be shorter than $\lambda/4$ at an operating frequency taking into account a wavelength shortening coefficient $1\sqrt{\epsilon}$ determined by the dielectric constant $\epsilon$ of the dielectric used. By selecting the ratio of the transmission-line equivalent length l to the $\lambda/4$ as desired, the value of a capacitive reactance Xc can be designed as desired. A capacitance $C = \frac{1}{2}\pi fo\ Xc$ can be determined from the capacitive reactance Xc and the operating frequency fo.

If the transmission-line equivalent length l is shortened to a transmission-line equivalent length l', the capacitive reactance Xc is changed to a capacitive reactance Xc'. A capacitance $C' = \frac{1}{2}\pi fo\ Xc'$ can be determined from the capacitive reactance Xc' and the operating frequency fo. The capacitance is thus varied since $C' < C$. The capacitor having the capacitance C is equivalent to the variable capacitor 108 shown in FIG. 16(b). The length of the spiral electrode (the spiral electrode 40 in FIG. 15(c)) forming the capacitor electrode which is grounded has been illustrated as being the same as the length of the spiral electrode (the spiral electrode 39 in FIG. 15(a)) forming the inductor electrode. However, the capacitor electrdoe may be of any desired length shorter than the inductor electrode, and may be formed at any desired position confronting the inductor electrode.

FIGS. 18, 19, 20 and 21 are illustrative of the manner in which the variable capacitor and the variable inductor of the resonator filter of FIGS. 15(a) through 15(c) are variably adjusted.

Figure 18:
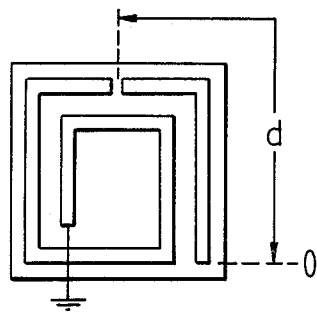
FIG. 18 is a front elevational view of the resonator filter of FIGS. 15(a) through 15(c), explanatory of an variable adjustment mode.
Figure 19:
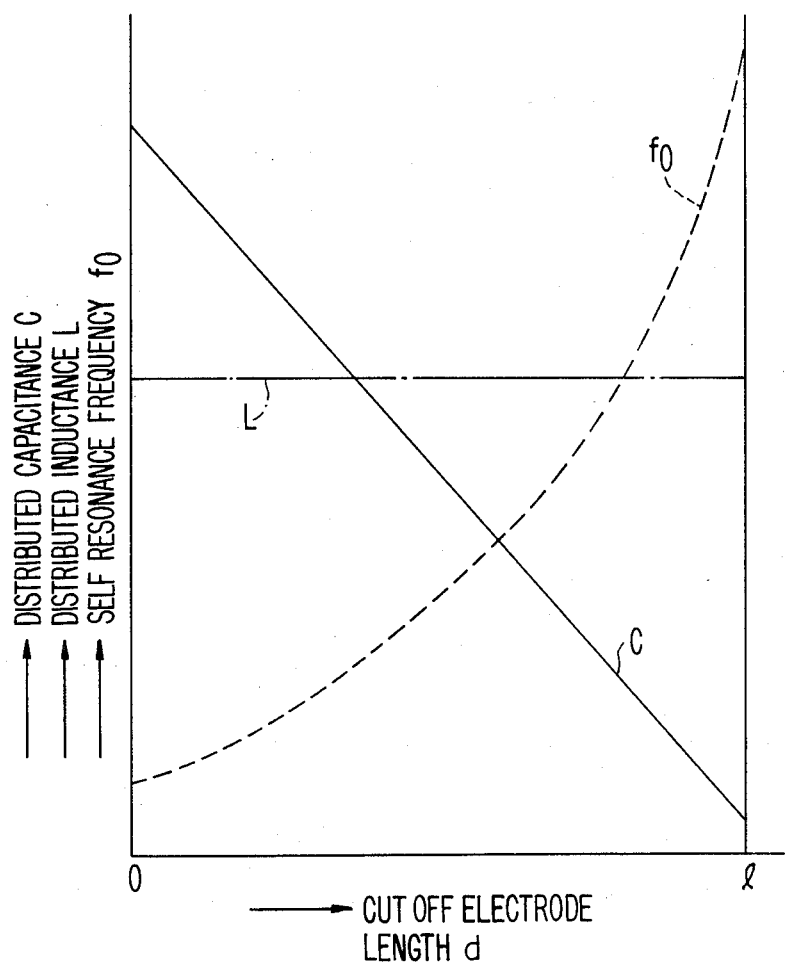
FIG. 19 is a diagram showing characteristic curves explanatory of the variable adjustment mode of the resonator filter of FIGS. 15(a) through 15(c)
Figure 20:
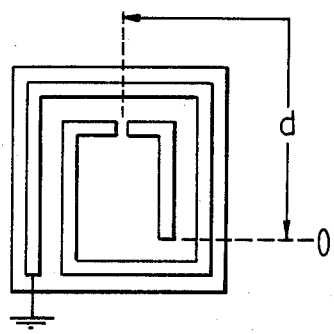
FIG. 20 is a rear elevational view of the resonator filter of FIGS. 15(a) through 15(c), explanatory of a variable adjustment mode.
Figure 21:
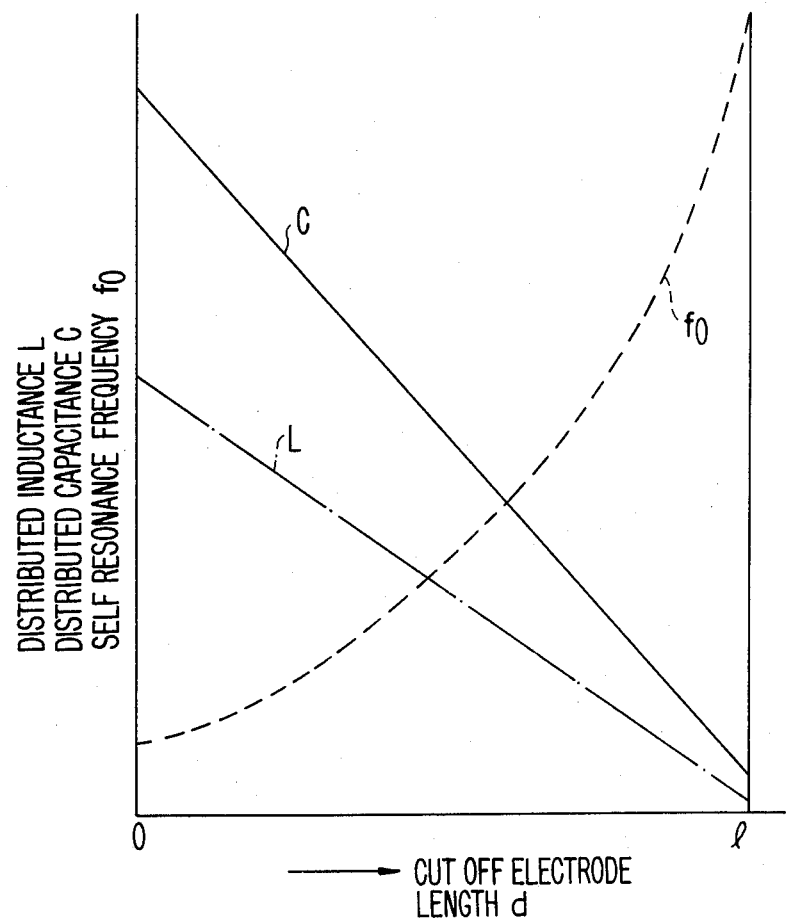
FIG. 21 is a diagram showing characteristic curves explanatory of the variable adjustment mode of the resonator filter of FIGS. 15(a) through 15(c)

FIGS. 18 and 19 are explanatory of a mode for adjusting the variable capacitor by cutting off the capacitor electrode. FIG. 19 shows the relationship between an electrode length d from the open terminal to the cut-off position, a distributed capacitance C over the electrode length d, a distributed inductance L over the electrode length d, and a self-resonant frequency fo for the electrode length d. As the electrode length d increases, the distributed capacitance C is reduced but the distributed inductance L remains unchanged, and the self-resonant frequency fo goes higher. FIGS. 20 and 21 are explanatory of a mode for simultaneously adjusting the variable inductor and the variable capacitor by cutting off the inductor electrode. FIG. 21 shows the relationship between an electrode length d from the open terminal to the cut-off position, a distributed capacitance C over the electrode length d, a distributed inductance L over the electrode length d, and a self-resonant frequency fo for the electrode length d. As the electrode length d increases, both the distributed inductance L and the distributed capacitance C are reduced, and the self-resonant frequency fo goes higher.

The electrode may be cut off by a non-contant cutter means such as a laser cutter or a sand blaster which does not affect the tuning frequency during cutting operation.

With the above embodiment, the inductor electrode and the capacitor electrode are shared by each other and the inductance of the capacitor electrode which is grounded is cancelled out, so that the variable inductor and the variable capacitor are of an integral construction.

Each of the electrodes in the above embodiments may be composed of a metal conductor, a printed thin metal conductor, a thick film conductor, or a thin film conductor, and the confronting electrodes may comprise conductors of different types. The electrodes may be disposed in the dielectric, rather than on the surface thereof. The electrode surfaces may be protected by another dielectric material which hermetically seals the electrodes. The dielectric may be made of alumina ceramic, barium titanate, plastics, polyethylene fluoride, glass, mica, or in the form of a printed-circuit board of resin base.

As described above, the electrodes are disposed in confronting relation to each other with the dielectric base plate interposed therebetween and at least one of the electrodes is disposed in the dielectric base plate or the electrodes are placed parallel to each other on one surface of the dielectric base plate, with the ground terminals of the electrodes being located in opposite relation remotely from each other. At least one of the electrodes is cut off at a portion thereof. The resonator filter thus constructed has the following advantages:

(1) The variable inducator and the variable capacitor are of a simple integral construction.

(2) The resonator filter is of an extremely low profile and an extremely small size.

(3) Since the resonator filter may be of a module, its tuning frequency after adjustment is quite stable, and any shift in the tuning frequency due to mechanical vibrations is held to minimum.

(4) Since the variable inductor and the variable capacitor are interconnected without leads, the circuit operation is highly stable without being affected by any lead inductance and stray capacity.

(5) The number of parts used can be reduced, and the manufacturing process is improved, with the result that the cost of manufacture can be lowered.

(6) The capacitor and inductor can be adjusted by a non-contact cutter means without affecting the tuning frequency.

(7) The speed of adjusting the capacitor and inductor is increased.

The initial values of the inductance and the capacitance for the setting of the tuning frequency of the resonator filter are dependent on a simple artwork for an electrode pattern, so that the resonator filter can be designed with increased freedom and the constants can easily be corrected.

Figure 22A:
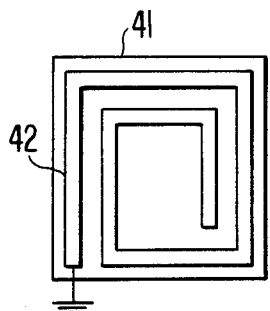
FIGS. 22(a) through 22(c) are front, side, and rear elevational views of a resonator filter according to another embodiment of the present invention.
Figure 22B:
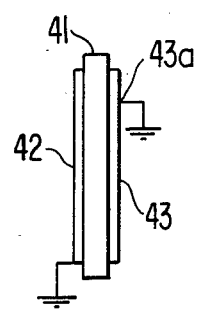
Figure 22C:
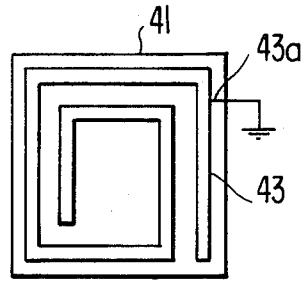

FIGS. 22(a) through 22(c) are illustrative of the construction of a resonator filter according to still another embodiment of the present invention. Electrodes 42, 43 are mounted on opposite surfaces of a dielectric 41 in the from of a plate. The electrodes are mounted on the dielectrics and have a terminal arrangement in the same manner as described with reference to the embodiment of FIGS. 4(a) through 4(c). However, each of the electrodes has a spiral configuration.

If it is desired to adjust the capacitance of the distributed capacitor or the inductance of the distributed inductor, the electrode 43 is grounded at a desired portion 43a.

Shifting the position wherein the ground terminal is connected will be described in greater detail.

By selecting the position in which the ground terminal is connected as shown in FIG. 22(a), the ground terminal is connected to a distributed inductor 109 at a desired electrode portion 109a. As a result, the values of a distributed capacitance 110 and the distributed inductance 109 can be varied as desired.

Figure 23A:
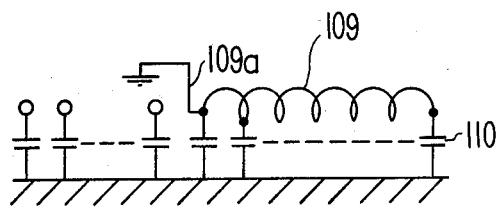
FIGS. 23(a) and 23(b) are circuit diagrams of equivalent circuits of the resonator filter shown in FIGS. 22(a) through 22(c)
Figure 23B:
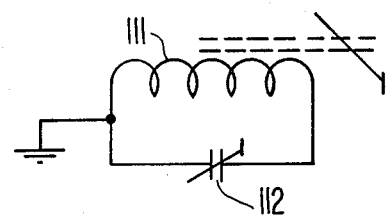

FIG. 23(b) illustrates the resonator filter in the form of a lumped-constant equivalent circuit which comprises a parallel-connected circuit of a variable inductor 111 and a variable capacitor 112.

Figure 24:
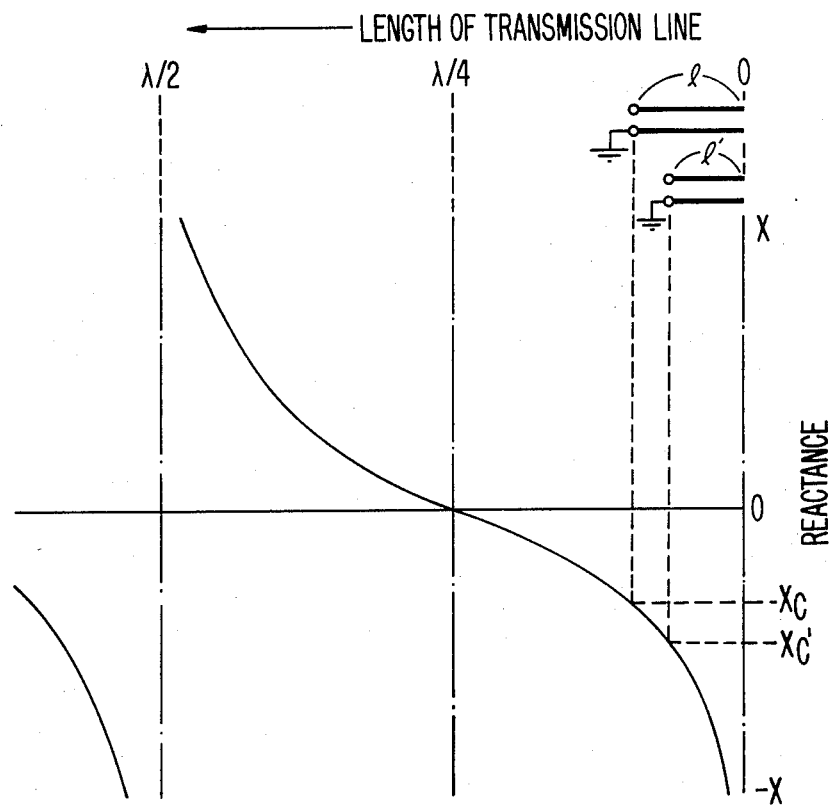
FIG. 24 is a diagram illustrative of operation of the resonator filter of FIGS. 22(a) through 22(c)

The inductance of the inductor of the resonator filter can be designed as desired by adjusting the number of turns of the spiral electrodes or the length of the spiral electrodes. The capacitance of the distributed capacitor can be designed as desired by adjusting the area in which the spiral electrodes confront each other, the dielectric constant and thickness of the dielectric. The formation of the distributed capacitance will be described further with reference to FIG. 24. The confronting spiral electrodes has a transmission-line equivalent length l which is designed to be shorter than $\lambda/4$ at an operating frequency taking into account a wavelength shortening coefficient $1/\sqrt{\epsilon}$ determined by the dielectric constant $\epsilon$ of the dielectric used. By selecting the ratio of the transmission-line equivalent length l to the $\lambda/4$ as desired, the value of a capacitive reactance Xc can be designed as desired. A capacitance $C = \frac{1}{2}\pi fo$ Xc can be determined from the capacitive reactance Xc and the operating frequency fo.

If the transmission-line equivalent length l is shortened to a transmission-line equivalent length l', the capacitive reactance Xc is changed to a capacitive reactance Xc'. A capacitance $C' = \frac{1}{2}\pi fo$ Xc' can be determined from the capacitive reactance Xc' and the operating frequency fo. The capacitance is thus varied since C' < C. The capacitor having the capacitance C is equivalent to the variable capacitor 112 shown in FIG. 23(b). The length of the spiral electrode (the spiral electrode 43 in FIG. 22(c)) forming the capacitor electrode which is grounded has been illustrated as being the same as the length of the spiral electrode (the spiral electrode 42 in FIG. 22(a)) forming the inductor electrode. However, the capacitor electrode may be of any desired length shorter than the inductor electrode, and may be formed at any desired position confronting the inductor electrode.

FIGS. 25, 26, 27 and 28 are illustrative of the manner in which the variable capacitor and the variable inductor of the resonator filter of FIGS. 22(a) through 15(c) are variably adjusted.

Figure 25:
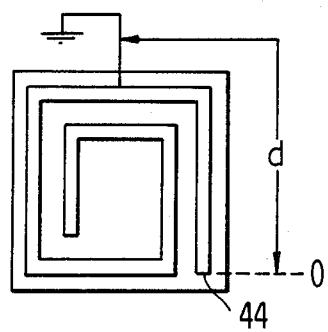
FIG. 25 is a front elevational view of the resonator filter of FIGS. 22(a) through 22(c), explanatory of an adjustment variable mode.
Figure 26:
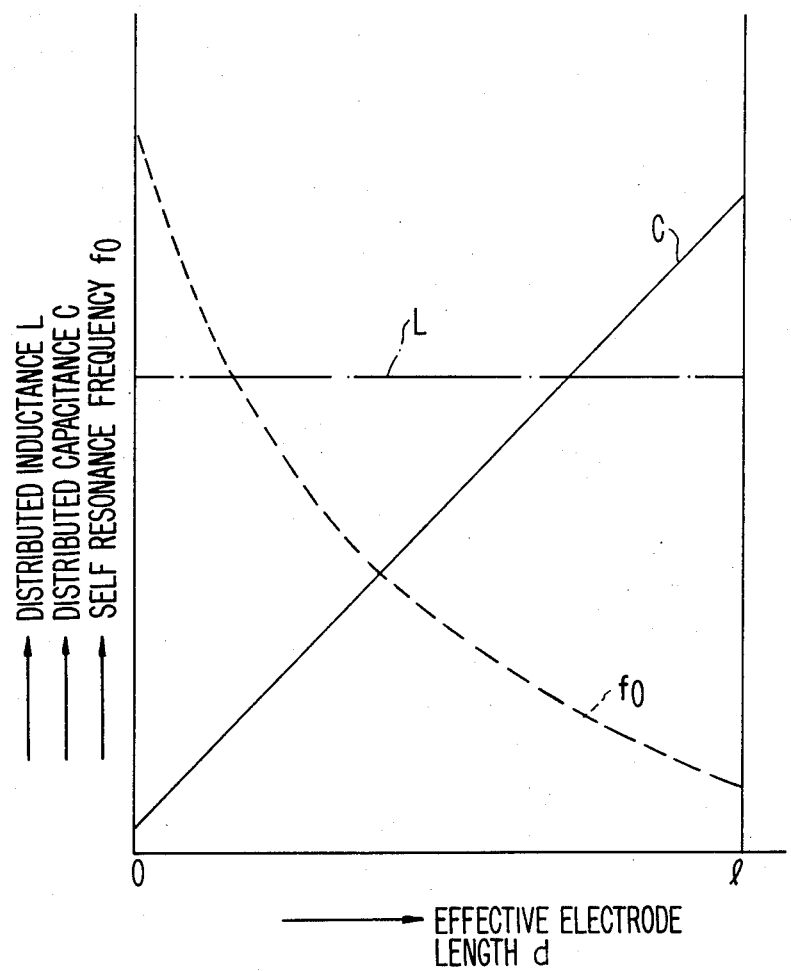
FIG. 26 is a diagram showing characteristic curves explanatory of the adjustment variable mode of the resonator filter of FIGS. 22(a) through 22(c)

FIGS. 25 and 26 are explanatory of a mode for adjusting the variable capacitor by positionally adjusting the grounded position of the capacitor electrode. FIG. 26 shows the relationship between an effective electrode length d from the open terminal 44 to the ground terminal position, a distributed capacitance C over the effective electrode length d, a distributed inductance L over the effective electrode length d, and a self-resonant frequency fo for the effective electrode length d. As the effective electrode length d increases, the distributed capacitance C is reduced but the distributed inductance L remains unchanged, and the self-resonant frequency fo goes lower. FIGS. 27 and 28 are explanatory of a mode for simultaneously adjusting the variable inductor and the variable capacitor by positionally adjusting the ground terminal position of the inductor electrode. FIG. 28 shows the relationship between an effective electrode length d from the open terminal 45 to the ground terminal position, a distributed capacitance C over the effective electrode length d, a distributed inductance L over the effective electrode length d, and a self-resonant frequency fo for the effective electrode length d. As the effective electrode length d increases, both the distributed inductance L and the distributed capacitance C are reduced, and the self-resonant frequency fo goes lower.

With the arrangement of the above embdoment, the inductor electrode and the capacitor electrode are shared by each other and the inductance of the capacitor electrode which is grounded is cancelled out, so that the variable inductor and the variable capacitor are of an integral construction.

Each of the electrodes in the above embodiment may be composed of a metal conductor, a printed thin metal conductor, a thick film conductor, or a thin film conductor, and the confronting electrodes may comprise conductors of different types. The electrodes may be disposed in the dielectric, rather than on the surface thereof. The electrode surfaces may be protected by another dielectric material which hermetically seals the electrodes. The dielectric may be made of alumina ceramic, barium titanate, plastics, polyethylene fluoride, glass, mica, or in the form of a printed-circuit board of resin base.

As described above, the electrodes are disposed in confronting relation to each other with the dielectric base plate interposed therebetween and the ground terminals connected to the electrodes are positioned differently for the respective electrodes. The resonator filter of the above construction has the following advantages:

(1) The variable inducator and the variable capacitor are of a simple integral construction.

(2) The resonator filter is of an extremely low profile and an extremely small size.

(3) Since the resonator filter may be of a module, its tuning frequency after adjustment is quite stable, and any shift in the tuning frequency due to mechanical vibrations is held to minimum.

(4) Since the variable inductor and the variable capacitor are interconnected without leads, the circuit operation is highly stable without being affected by any lead inductance and stray capacity.

(5) The number of parts used can be reduced, and the manufacturing process is improved, with the result that the cost of manufacture can be lowered.

(6) The capacitor and inductor can be adjusted by nondestructive means.

(7) The capacitance or the inductance can repeatedly be increased and reduced.

(8) The speed of adjusting the capacitor and inductor is increased.

The initial values of the inductance and the capacitance for the setting of the tuning frequency of the resonator filter are dependent on a simple artwork for an electrode pattern, so that the resonator filter can be designed with increased freedom and the constants can easily be corrected.

FIG. 29 is a circuit diagram of a balanced resonator filter according a still further embodiment of the present invention. The balanced resonator filter has a main electrode 46 having a neutral ground terminal 47 and forming a distributed inductor, the main electrode 46 also having balanced terminals 48, 49. The balanced resonator filter also has an auxiliary electrode 50 confronting the main electrdoe 46 with a dielectric (not shown) interposed therebetween and having opposite ends serving as ground terminals 51, 52, respectively. A hypothetical neutral point can be provided to achieve an equivalent ground terminal wihtout having to add the ground terminal 47 to the main electrode 46. The balanced terminals 48, 49 may be located at any positions presenting desired impedances, rather than on the ends of the main electrode 46. The ground terminals 51, 52 of the auxiliary electrode 50 may also be located at any desired positions. According to the embodiment of FIG. 29, the balanced resonator filter is of a simple construction having the individual main and auxiliary electrodes.

FIG. 30 is a circuit diagram of a balanced resonator filter according another embodiment of the present invention. The balanced resonator filter has main electrodes 53, 54 having neutral ground terminals 55, 56 and balanced terminals 57, 58. The balanced resonator filter also has an auxiliary electrode 56 confronting the main electrdoes 53, 54 with a dielectric (not shown) interposed therebetween and having a ground terminal 60 disposed in substantial alignment with the balanced terminals 57, 58 of the main electrodes 53, 54. The balanced terminals 57, 58 may be located at any positions presenting desired impedances, rather than on the ends of the main electrodes 53, 54. With this embodiment, the balanced terminals 57, 58 may be disposed closely to each other so that signal input and output leads can be of a short length.

FIG. 31 is a circuit diagram of a balanced resonator filter according still another embodiment of the present invention. The balanced resonator filter has a main electrode 64 having a neutral ground terminal 61 and balanced terminals 62, 63, as with the balanced resonator filter of FIG. 29. However, the balanced resonator filter has auxiliary electrodes 67, 68 having ground terminals 65, 66, respectively. The ground terminals 61, 65, 66 and the balanced terminals 62, 63 may be arranged in the same manner as described with reference to FIG. 29. By cutting off the auxiliary electrodes 67, 68 shown in FIG. 31 and the auxiliary electrode 59 shown in FIG. 30 at desired positions close to the open terminals, the distributed capacitance can be varied to change the tuning frequency and adjust the balanced condition.

FIG. 32 is a circuit diagram of a balanced resonator filter according still another embodiment of the present invention. The balanced resonator filter includes a tuning section 71 composed of a main electrode 69 and an auxiliary electrode 70 as with the embodiment of FIG. 29. The main electrode 69 has balanced terminals 74, 75 connected to voltage-variable capacitance diodes 74, 75 and balanced terminals of a balanced-to-unbalanced mode converter 76 which has an unbalanced terminal 77. The diodes 74, 76 are connected to a control voltage terminal 78. The auxiliary electrode 70 is connected to an unbalanced secondary tap terminal 79. Although the tuning section 71 is the same as shown in FIG. 29, it may be composed of the arrangement shown in FIG. 30 or 31. The voltage-variable capacitance diodes 74, 76 and the balanced-to-unbalanced mode converter 76 may not be connected together, but may be installed individually. With the embodiment of FIG. 32, there can be provided a balanced variable resonator filter in which the tuning frequency can be varied and which can be connected to an unbalanced signal circuit system. The voltage-variable capacitance diodes 74, 75 may be replaced with variable air capacitors. Where the tuning section 71 is constructed of the arrangement illustrated in FIG. 30 or 31, the auxiliary electrode 59 or the auxiliary electrodes 67, 68 may be cut off at desired positions to select any desired tuning frequency band and adjust the balanced condition.

Figure 33A:
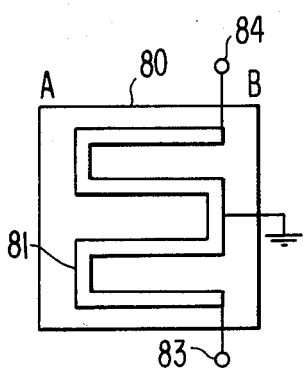
FIGS. 33(a), 33(b), 33(c) and 34(a), 34(b), 34(c) are front, side, and rear elevational views, respectively, of the balanced resonator filter shown in FIG. 29.
Figure 33B:
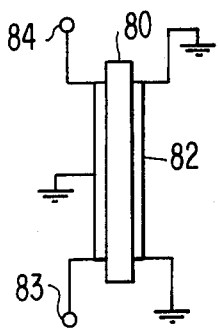
Figure 33C:
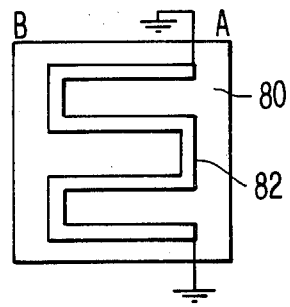

FIGS. 33(*a*), 33(*b*) and 33(*c*) and 34(*a*), 34(*b*) and 34(*c*) are illustrative of the construction of the main and auxiliary electrodes and a dielectric for the balanced resonator filter shown in FIG. 29.

In FIGS. 33(*a*) through 33(*c*), the resonator filter has a dielectric base plate 80 and main and auxiliary electrodes 81, 82 forming a distributed-constant circuit providing a distributed inductor and a distributed capacitor. The main and auxiliary electrodes 81, 82 have ground terminals positioned remotely from each other between the confronting main and auxiliary electrodes as shown in FIGS. 29 and 31. (The ground terminals in FIGS. 34(*a*) through 34(*c*) are similarly arranged.) Sides A, B shown in FIG. 33(*a*) correspond respectively to sides A, B in FIG. 33(*c*). (This also holds true in FIGS. 34(*a*) through 34(*c*).)

In FIGS. 33(*a*) through 33(*c*), the electrodes 81, 82 of a meandering configuration are disposed in a confronting relationship to each other with the dielectric base plate 80 interposed therebetween.

Figure 34A:
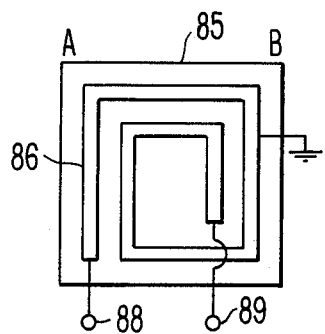
Figure 34B:
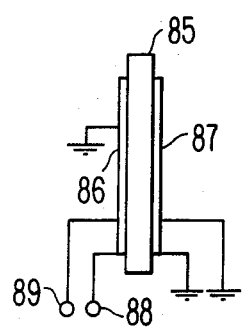
Figure 34C:
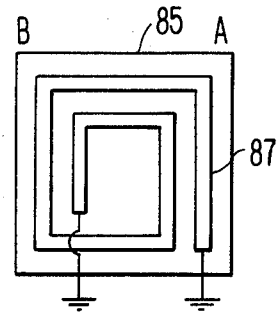

In FIGS. 34(a) through 34(c), electrodes 86, 87 of a spiral configuration are disposed in a confronting relationship to each other with a dielectric base plate 85 interposed therebetween.

The manner in which a voltage-variable capacitor is connected to the resonator filter shown in FIGS. 7(a) through 7(c) will be described with reference to FIGS. 35 and 36 which illustrate overall resonator filters according to different embodiments of the present invention.

Figure 35:
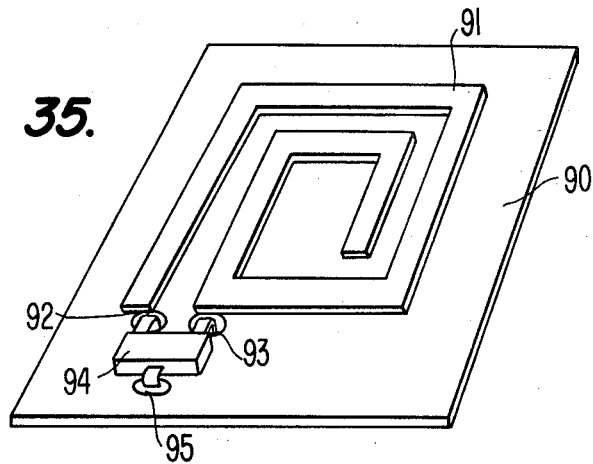
FIGS. 35 and 36 are perspective views of resonator filters according to still other embodiments of the present invention.
Figure 36:
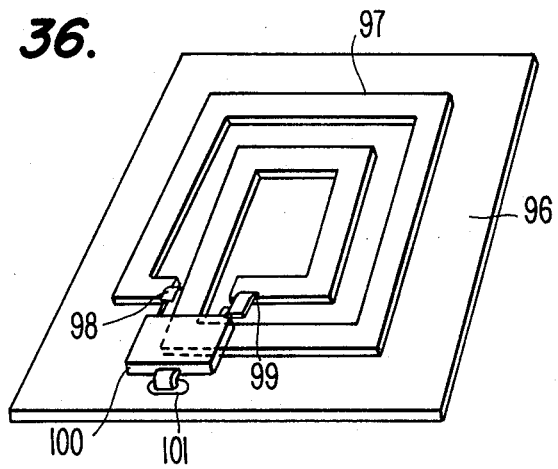

FIG. 35 shows an overall resonator filter according to an embodiment of the invention (only one electrode shown with the opposite electrode omitted from illustration, which holds true also for FIG. 36). A spiral electrode 91 (which may form an inductor or a capacitor, this being true also for FIG. 36) is placed on a dielectric base plate 90 and has a ground terminal 92. A voltage-variable capacitor 94 has an anode connected bewteen the ground terminal 92 and a desired portion of the spiral electrode 91, and a voltage control terminal 95 serving as a common cathode of the voltage-variable capacitor 94.

FIG. 36 shows an overall resonator filter according to another embodiment of the invention. A spiral electrode 97 is placed on a dielectric base plate 96 and has a ground terminal 98. A voltage-variable capacitor 100 has an anode connected bewteen the ground terminal 98 and an open terminal 99 of the spiral electrode 97, and a voltage control terminal 101 serving as a common cathode of the voltage-variable capacitor 94.

In the overall resonator filter constructions shown in FIGS. 35 and 36, the variable inductor and capacitor and the voltage-variable capacitor are connected with no lead connector conductors or by quite short paths.

While in the embodiments of FIGS. 35 and 36 the voltage-variable capacitors 94, 100 are of the twin type, they may be of the single type in which case a DC voltage blocking capacitor (not shown) is connected between the cathode or the voltage control terminal and the electrode forming the variable inductor or the variable capacitor.

With the above embodiments, the inductor electrode and the capacitor electrode are shared with each other and disposed in a confronting relationship with the dielectric interposed therebetween, the capacitor electrode being grounded with its inductance cancelled. One or both of the electrodes are cut off or grounded at any desired portions thereof, thereby forming a variable inductor and a variable capacitor. The voltage-variable capacitor is connected directly or by short paths between the ground terminal of one of the confronting electrodes and any desired portion thereof. The resonator filter of the above construction has the following advantages:

(1) The variable inductor and capacitor and the voltage-variable capacitor are connected with no lead connector conductors or by quite short paths.

(2) Thus, no unwanted resistance is present in the resonator filter and the Q thereof can be improved.

(3) The circuit operation of the resonator filter is highly stable without being affected by any lead inductance and stray capacity.

(4) The entire resonator filter can be fabricated as a simple, low-profile, small-size and integral module, or can be assembled integrally into a dielectric circuit board.

(5) Since the resonator filter as adjusted has no mechanical moving parts, any shift in the tuning frequency due to mechanical vibrations can be reduced to a minimum.

(6) It is possible to form the electrodes of the resonator filter simultaneously with the circuit of another circuit element. The number of parts used can thus be reduced, and the resonator filter can be manufactured in an simplified process and at a lower cost.

(7) Where the tuning frequency of the resonator filter is adjusted by cutting off the electrode, a non-contact adjusting means may be employed for frequency adjustment without influencing the tuning frequency.

(8) Where the tuning frequency of the resonator filter is ajusted by adjusting the ground terminal position, a nondestructive adjusting means may be employed so that the tuning frequency of the resonator can repeatedly be adjusted up and down.

The initial values of the variable inductance and the variable capacitance for the setting of the tuning frequency of the resonator filter are dependent on a simple artwork for an electrode pattern, so that the resonator filter can be designed with increased freedom and the constants can easily be corrected.

While the embodiments shown in FIGS. 9(a), 9(b), 15, 18, 20, 22, 25, 27, 29 through 36 have been described using respective typical transmission-line electrode patterns, all of these embodiments may be achieved, with the same advantages, by employing any desired transmission-line electrode patterns shown in FIGS. 4(a), 4(b) and 4(c) through 8(a), 8(b) and 8(c).

What is claimed is:

1. A resonator filter comprising:
    a dielectric; and
    a pair of first and second electrodes electrically confronting each other through said dielctric, each of said first and second electrodes having at least one bent portion to present primarily a lumped-constant inductance and having a desired equivalent electrical length,
    said first and second electrodes having ground or common terminals located out of mutually confronting positions so that voltage signals induced by mutual induction between said electrodes will be opposite in phase with respect to each other, thereby producing a parasitic distributed-constant capacitance due to a potential difference between said electrodes and a dielectric constant of said dielectric; and
    said first electrode having a first terminal at a desired position thereof so that said electrodes form a two-terminal circuit network having said first terminal with said ground or common terminals serving as a second terminal, said two-terminal circuit network forming an equivalent parallel resonant bandpass filter circuit composed of a lumped-constant inductor formed by said first electrode and a parasitic distributed-constant capacitor between said first and second electrodes.

2. The resonator filter according to claim 1, wherein each of said electrodes has a spiral shape.

3. The resonator filter according to claim 1, wherein each of said electrodes has a zigzag shape.

4. The resonator filter according to claim 1, wherein said electrodes are disposed on one surface of said dielectric.

5. The resonator filter according to claim 1, wherein at least one of said electrodes is at least partly embedded in said dielectric.

6. The resonator filter according to claim 1, wherein said dielectric is in the form of a hollow cylinder.

7. The resonator filter according to claim 1, wherein said dielectric is in the form of a ring.

8. The resonator filter according to claim 1, wherein said dielectric is in the form of a plate.

9. The resonator filter according to claim 1, wherein at least on of said electrodes has a portion cut off for adjusting the resonance frequency.

10. The resonator filter according to claim 1, wherein one of said electrodes has the ground or common terminal at the center thereof, and the other of said electrodes has the ground or common terminals at both ends thereof.

11. The resonator filter according to claim 1, further comprising a reactance element connected between said first terminal and said ground or common terminal.

12. A resonator filter comprising:
a dielectric; and
a pair of first and second electrodes disposed on opposite surfaces of said dielectric respectively so as to electrically confront each other through said dielectric, each of said first and second electrodes having at least one bent portion to present primarily a lumped-constant inductance and having a desired equivalent electrical length,
said first and second electrodes having ground or common terminals located out of mutually confronting positions so that voltage signals induced by mutual induction between said electrodes will be opposite in phase with respect to each other, thereby producing a parasitic distributed-constant capacitance due to a potential difference between said electrodes and a dielectric constant of said dielectric; and said first electrode having a first terminal at a desired position thereof so that said electrodes form a two-terminal circuit network having said first terminal with said ground or common terminals serving as a second terminal, said two-terminal circuit network forming an equivalent parallel resonant bandpass filter circuit composed of a lumped-constant inductor formed by said first electrode and a parasitic distributed-constant capacitor between said first and second electrodes.

13. The resonator filter according claim 12, wherein each of said electrodes has a spiral shape.

14. The resonator filter according to claim 12, wherein each of said electrodes has a zigzag shape.

15. The resonator filter according to claim 12, wherein at least one of said electrodes has a portion cut off for adjusting the resonance frequency.

16. The resonator filter according to claim 12, wherein said dielectric is in the form of a plate.

17. A resonator filter comprising:
a dielectric plate; and
a pair of first and second electrodes disposed on opposite surfaces of said dielectric plate respectively so as to electrically confront each other through said dielectric plate, each of said first and second electrodes having a spiral shape to present primarily a lumped-constant inductance and having a desired equivalent electrical length,
said first and second electrodes having ground or common terminals located out of mutually confronting positions so that voltage signals induced by mutual induction between said electrodes will be opposite in phase with respect to each other, thereby producing a parasitic distributed-constant capacitance due to a potential difference between said electrodes and a dielectric constant of said dielectric; and
said first electrode having a first terminal at a desired position thereof so that said electrodes form a two-terminal circuit network having said first terminal with said ground or common terminals serving as a second terminal, said two-terminal circuit network forming an equivalent parallel resonant bandpass filter circuit composed of a lumped-constant inductor formed by said first electrode and a parasitic distributed-constant capacitor between said first and second electrodes.

18. The resonator filter according to claim 17, wherein at least one of said electrodes has a portion cut off for adjusting the resonance frequency.

19. The resonator filter according to claim 18, further comprising a reactance element connected between said first terminal and said ground or common terminal.

20. The resonator filter according to claim 19, wherein said reactance element comprises a voltage-variable capacitance diode.

21. The resonator filter according to claim 17, wherein one of said electrodes has the ground or common terminal at the center thereof, and the other of said electrodes has the ground or common terminals at both ends thereof.

22. The resonator filter according to claim 21, further comprising a reactance element connected between said first terminal and said ground or common terminal.

23. The resonator filter according to claim 22, wherein said reactance element comprises a voltage-variable capacitance diode.

* * * * *